United States Patent
Okuda

(10) Patent No.: US 10,095,125 B2
(45) Date of Patent: Oct. 9, 2018

(54) MEASUREMENT APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Hiroshi Okuda, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 15 days.

(21) Appl. No.: 15/231,003

(22) Filed: Aug. 8, 2016

(65) Prior Publication Data
US 2017/0052462 A1    Feb. 23, 2017

(30) Foreign Application Priority Data

Aug. 20, 2015 (JP) .................. 2015-163088

(51) Int. Cl.
G03F 7/20 (2006.01)
G01B 9/02 (2006.01)
G02B 5/136 (2006.01)

(52) U.S. Cl.
CPC ..... *G03F 7/70775* (2013.01); *G01B 9/02018* (2013.01); *G01B 9/02019* (2013.01); *G01B 9/02028* (2013.01); *G01B 9/02058* (2013.01); *G01B 9/02061* (2013.01); *G02B 5/136* (2013.01); *G03F 7/7085* (2013.01)

(58) Field of Classification Search
CPC .. G01B 9/02; G01B 9/02018; G01B 9/02058; G01B 9/02061; G02B 5/136; G03F 7/70775; G03F 7/7085
USPC ............... 310/12.16, 12.19; 355/53, 72, 75; 356/450, 614
See application file for complete search history.

(56) References Cited

U.S. PATENT DOCUMENTS

| 6,507,441 B1* | 1/2003 | Eisenberg | G02B 3/0056 |
| | | | 359/619 |
| 2008/0165345 A1* | 7/2008 | Hill | G01D 5/266 |
| | | | 356/72 |

FOREIGN PATENT DOCUMENTS

| JP | 2001141413 A | 5/2001 |
| JP | 2003315008 A | 11/2003 |

OTHER PUBLICATIONS

Machine translation of JP 2001-141413.*

* cited by examiner

*Primary Examiner* — Colin Kreutzer
(74) *Attorney, Agent, or Firm* — Rossi, Kimms & McDowell LLP

(57) ABSTRACT

The present invention provides a measurement apparatus for measuring a position of an object, comprising a reflecting portion provided on the object and having a surface on which reflectors configured to retroreflect light are arrayed, an optical system configured to cause first light to be incident on the surface, receive second light as reflected light of the first light, cause third light generated from the second light to be incident on the surface, and receive fourth light as reflected light of the third light, and a processor configured to determine the position of the object based on a detection result of the forth light, wherein the optical system is configured such that a displacement between optical paths of the first light and the second light is corrected by a displacement between optical paths of the third light and the fourth light.

11 Claims, 4 Drawing Sheets

MEASUREMENT APPARATUS, LITHOGRAPHY APPARATUS, AND METHOD OF MANUFACTURING ARTICLE

BACKGROUND OF THE INVENTION

Field of the Invention

The present invention relates to a measurement apparatus for measuring the position of an object, a lithography apparatus, and a method of manufacturing an article.

Description of the Related Art

There is a measurement apparatus which measures the position of an object based on the results of detection of light reflected by a reflecting surface formed on the object, and light reflected by a reference surface. It may become difficult for this measurement apparatus to accurately measure the position of an object (reflecting surface) if the object moves and the position and angle of the optical path of light (reflected light) reflected by the reflecting surface change relative to the optical path of light (incident light) to be incident on the reflecting surface. Japanese Patent Laid-Open No. 2001-141413 has proposed a measurement apparatus which measures the position of an object by using a reflecting surface on which a plurality of corner cubes are arrayed, thereby reducing the change in optical path of reflected light caused by the movement of the object.

In this measurement apparatus described in Japanese Patent Laid-Open No. 2001-141413, the change in optical path of reflected light caused by the movement of the object can be decreased by miniaturizing the corner cubes arrayed on the reflecting surface. However, the miniaturization of the corner cubes has its limit, so it is impossible to unlimitedly decrease the change in optical path of reflected light caused by the movement of the object. That is, using only the reflecting surface on which the plurality of corner cubes are arrayed may become insufficient to accurately measure the position of the object.

SUMMARY OF THE INVENTION

The present invention provides a measurement apparatus advantageous in, for example, accurately measuring the position of an object.

According to one aspect of the present invention, there is provided a measurement apparatus for measuring a position of an object, comprising: a reflecting portion provided on the object and having a reflecting surface on which a plurality of reflectors configured to retroreflect light are arrayed; an optical system configured to cause first light to be incident on the reflecting surface, receive second light as reflected light of the first light from the reflecting surface, cause third light generated by reflecting the second light by a mirror member to be incident on the reflecting surface, and receive fourth light as reflected light of the third light from the reflecting surface; and a processor configured to determine the position of the object based on a result of detecting the forth light and reference light, wherein the optical system is configured such that a displacement between optical paths of the first light and the second light is corrected by a displacement between optical paths of the third light and the fourth light.

Further features of the present invention will become apparent from the following description of exemplary embodiments with reference to the attached drawings.

DESCRIPTION OF THE EMBODIMENTS

Figure 1:
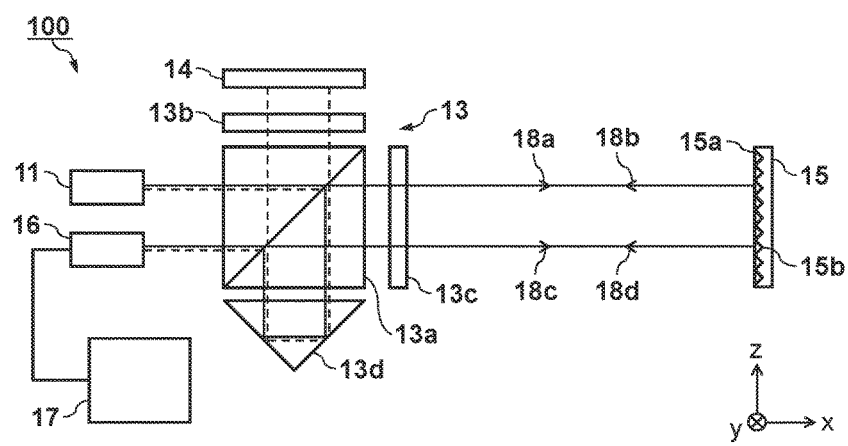
FIG. 1 is a view showing a measurement apparatus of a first embodiment.

Exemplary embodiments of the present invention will be described below with reference to the accompanying drawings. Note that the same reference numerals denote the same members throughout the drawings, and a repetitive description thereof will not be given.

A measurement apparatus according to the present invention is a measurement apparatus that includes a so-called Michelson interferometer, that is, this measurement apparatus irradiates a reflecting surface of a reflecting portion formed on an object, and measures the position of the object based on interference light of light reflected by the reflecting surface and light reflected by a reference surface. This measurement apparatus can use, for example, a reflecting portion having a corner cube (reflector) for retroreflecting light in order to reduce a change in angle of light reflected by the reflecting surface if the attitude of an object has changed due to the movement of the object. The operation principle of a conventional measurement apparatus using a reflecting portion having a corner cube will be explained below.

Figure 3:
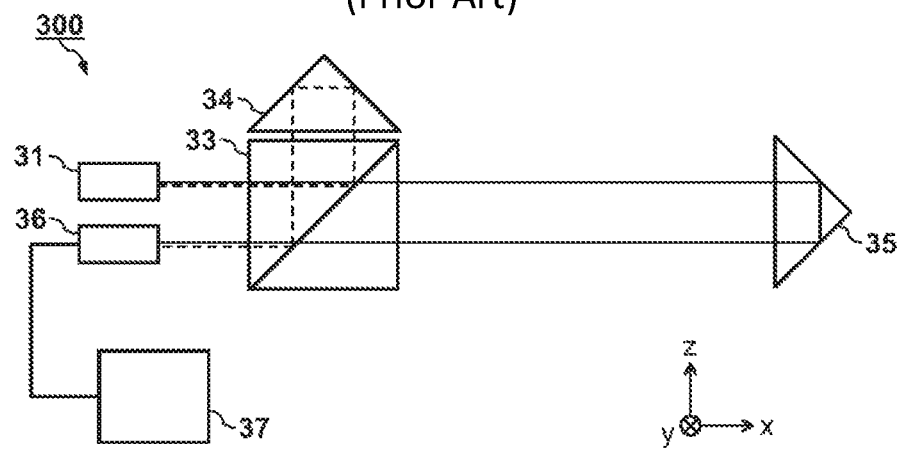
FIG. 3 is a view showing a conventional measurement apparatus using one corner cube as a reflecting portion.

First, a conventional measurement apparatus 300 using a reflecting portion having one corner cube will be explained. FIG. 3 is a view showing the conventional measurement apparatus 300 using one corner cube as a reflecting portion. The conventional measurement apparatus 300 shown in FIG. 3 includes, for example, a light source 31, a beam splitter 33, a corner cube 34 as a reference surface, a corner cube 35 formed as a reflecting portion (reflecting surface) on an object, a detector 36, and a processor 37. As the detector 36, a photodetector (point sensor) or the like can be used. Also, the processor 37 is a computer that includes a CPU, memory, and the like, and performs a process of determining the position of the object based on a detection result obtained by the detector 36.

Light emitted from the light source 31 and transmitted through the beam splitter 33 is retroreflected by the corner cube 35 and incident on the beam splitter 33 again, and light transmitted through the beam splitter 33 is incident on the detector 36. Also, light emitted from the light source 31 and reflected by the beam splitter 33 is retroreflected by the corner cube 34 as a reference surface and incident on the beam splitter 33 again, and light reflected by the beam splitter 33 is incident on the detector 36. The detector 36 detects an intensity difference between the light (reference light) reflected by the corner cube 34 and the light (reflected light) reflected by the corner cube 35. Accordingly, the processor 37 can obtain a difference between the optical path lengths of the reference light and object light based on the detection result obtained by the detector 36, and determine the position of the object on which the corner cube 35 is formed from the obtained difference.

Figure 4:
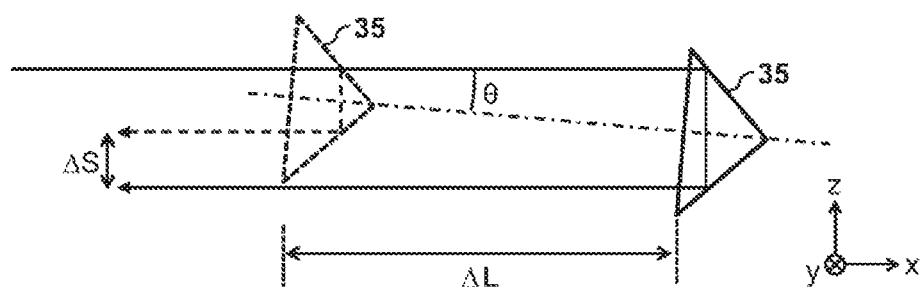
FIG. 4 is a view for explaining the shift amount of the optical path of reflected light resulting from the movement of an object.

Assume that in the conventional measurement apparatus 300 shown in FIG. 3, when the corner cube 35 (an object) is moved, the corner cube 35 is displaced in a direction (for example, the Z direction) perpendicular to the optical axis of incident light to the corner cube 35. For example, as shown in FIG. 4, assume that the corner cube 35 has moved along a direction at an angle θ with respect to the optical axis of incident light. In this case, the optical path of reflected light from the corner cube 35 after the movement shifts from the optical path of reflected light from the corner cube before the movement. Letting ΔL be the moving distance of the corner cube 35 in a direction (for example, the X direction) parallel to the optical axis of incident light, the amount (a shift amount ΔS) of shift of the optical path of reflected light is represented by:

$$\Delta S = 2 \times \Delta L \times \theta \quad (1)$$

When the optical path of reflected light thus shifts due to be movement of the corner cube 35, the incident positions of the reference light and reflected light on the detector 36 become different from each other. This causes an error on the detection result obtained by the detector 36, and makes it difficult to accurately measure the position of the object. For example, when the moving distance ΔL is 1 m and the angle θ is 100 sec, the shift amount ΔS of the optical path of reflected light is 1 mm. An error caused on the detection result by the shift amount ΔS is a very large value for a measurement apparatus for measuring the position of an object on the nanometer order. To improve the measurement accuracy, therefore, it is favorable to reduce the shift amount ΔS of the optical path of reflected light.

Figure 5:
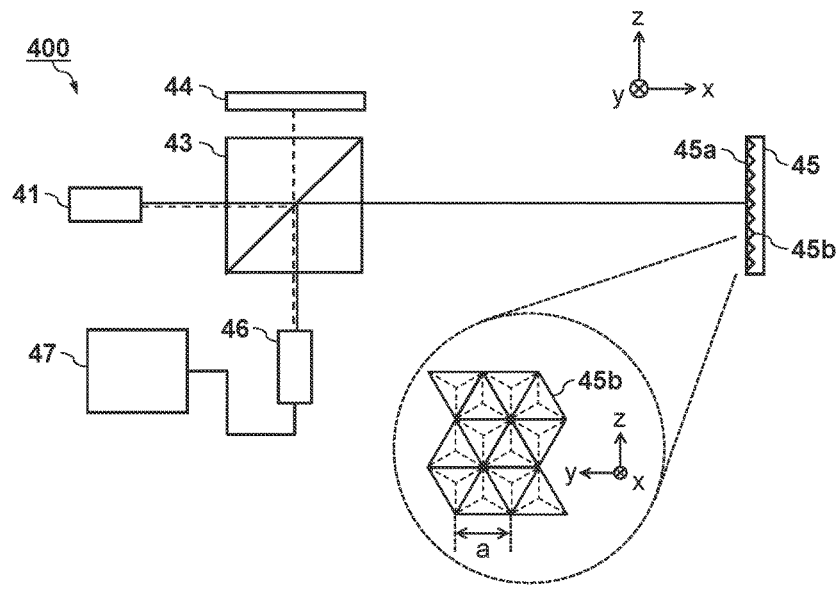
FIG. 5 is a view showing a measurement apparatus using a reflecting portion having a reflecting surface on which a plurality of corner cubes are arrayed.

To reduce the shift amount ΔS of the optical path of reflected light as described above, it is possible to use, for example, a reflecting portion having a reflecting surface on which a plurality of reflectors (corner cubes) for retroreflecting light are arrayed. FIG. 5 is a view showing a measurement apparatus 400 using a reflecting portion 45 having a reflecting surface 45a on which a plurality of corner cubes 45b are arrayed. The measurement apparatus 400 shown in FIG. 5 includes, for example, a light source 41, a beam splitter 43, a reference surface 44 (a planar mirror), the reflecting portion 45 having the reflecting surface 45a on which the plurality of corner cubes 45b are arrayed, a detector 46, and a processor 47.

As indicated by the broken-line circle in FIG. 5, the plurality of corner cubes 45b in the reflecting portion 45 can be arrayed so that the corner cubes come in contact with each other in a direction parallel to the reflecting surface 45a. A dimension "a" of each corner cube 45b may be smaller than the diameter of incident light to the reflecting surface 45a. Also, to equalize the phases of reflected light from the plurality of corner cubes 45b, it is favorable to array the corner cubes 45b at high accuracy so that, for example, a positional error from a target position in a direction perpendicular to the reflecting surface is ⅟₁₀ or less of the wavelength of incident light to the reflecting surface 45a. As the detector 46, a photodetector (point sensor) or the like can be used. Furthermore, the processor 47 is a computer that includes a CPU, memory, and the like, and performs a process of determining the position of an object based on the detection result obtained by the detector.

Light emitted from the light source 41 and transmitted through the beam splitter 43 is retroreflected by the reflecting surface 45a of the reflecting portion 45 on which the plurality of corner cubes 45b are arrayed, and incident on the beam splitter 43 again, and light reflected by the beam splitter 43 is incident on the detector 46. Also, light emitted from the light source 41 and reflected by the beam splitter 43 is reflected by the reference surface 44 and incident on the beam splitter 43 again, and light transmitted through the beam splitter 43 is incident on the detector 46. The detector 46 detects an intensity difference between the light (reference light) reflected by the reference surface 44 and the light (reflected light) reflected by the reflecting surface 45a. Accordingly, the processor 47 can obtain a difference between the optical path lengths of the reference light and object light based on the detection result obtained by the detector 46, and determine the position of the object on which the reflecting portion 45 is formed from the obtained difference.

Figure 6:
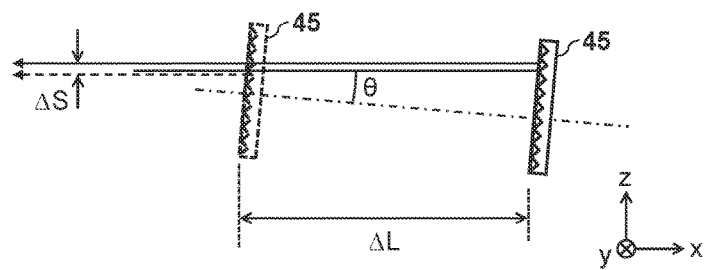
FIG. 6 is a view for explaining the shift amount of the optical path of reflected light resulting from the movement of an object.

As shown in FIG. 6, when using the reflecting portion 45 having the plurality of corner cubes 45b, the shift amount ΔS of the optical path of reflected light can be made smaller than that when using one corner cube (FIG. 4). That is, an error occurring in the detection result obtained by the detector 46 can be decreased. In the measurement apparatus 400 using the reflecting portion 45 having the plurality of corner cubes 45b, the shift amount ΔS of the optical path of reflected light is smaller than the double of the dimension "a" of the corner cube 45b, as represented by expression (2). For example, when the dimension "a" of the corner cube 45b is 50 μm, the shift amount ΔS of the optical path of reflected light can be decreased to 100 μm or less. Accordingly, the shift amount ΔS of the optical path of reflected light can be decreased by decreasing the dimension "a" of the corner cube 45b, that is, by miniaturizing the corner cube 45b.

$$\Delta S < 2a \quad (2)$$

Since, however, the miniaturization of the corner cube 45b has its limit, it is impossible to unlimitedly decrease the shift amount ΔS of the optical path of reflected light caused by the movement of the object. Therefore, the measurement apparatus according to the present invention is configured such that light reflected by a reflecting surface on which a plurality of corner cubes are arrayed is incident on the reflecting surface again, and a detector detects the reflected light. Also, the measurement apparatus according to the present invention is so configured that a displacement between the optical paths of first incident light and its reflected light is corrected (compensated) by a displacement between the optical paths of second incident light and its reflected light. This makes it possible to decrease the difference between the incident position of the second reflected light to the detector and the incident position of the reference light to the detector, and reduce an error occurring in the detection result obtained by the detector. Even when an object (reflecting portion) has moved, the measurement apparatus configured as described above can accurately measure the position of the object because the apparatus can decrease the change in difference.

<First Embodiment>

A measurement apparatus 100 of the first embodiment according to the present invention will be explained with reference to FIG. 1. The measurement apparatus 100 of the first embodiment includes, for example, a light source 11, an optical system 13, a reference surface 14 (a planar mirror), a reflecting portion 15 formed on an object, a detector 16, and a processor 17. A photodetector (point sensor) or the like can be used as the detector 16, but an image sensor including a plurality two-dimensionally arrayed photoelectric converters may also be used. The processor 17 is a computer that includes a CPU, memory, and the like, and performs a process of determining the position of an object based on the detection result obtained by the detector 16.

Like the measurement apparatus 400 shown in FIG. 5, the reflecting portion 15 has a reflecting surface 15a on which a plurality of corner cubes 15b are arrayed. The plurality of corner cubes 15b in the reflecting portion 15 may be so configured that a displacement between the optical paths of first light 18a and second light 18b is 100 μm or less. In this case, according to expression (2) described above, a dimension "a" of each corner cube 15b may be 50 μm or less. Also, each corner cube 15b may be so configured that the dimension "a" is smaller than the diameter of incident light (the first light 18a and third light 18c) to the reflecting surface 15a.

The optical system 13 causes light (the first light 18a) emitted from the light source 11 to be incident on the reflecting surface 15a, and receives the second light 18b as reflected light of the first light 18a from the reflecting surface 15a. Then, the optical system 13 causes the third light 18c generated by reflecting the second light 18b by a mirror member 13d to be incident on the reflecting surface 15a, and receives fourth light 18d as reflected light of the third light 18c from the reflecting surface 15a. As shown in FIG. 1, the optical system 13 of the first embodiment can include, for example, a polarizing beam splitter 13a, a λ/4 waveplate 13b, a λ/4 waveplate 13c, and the mirror member 13d (a corner cube).

S-polarized light emitted from the light source 11 and reflected by the polarizing beam splitter 13a is transmitted through the λ/4 waveplate 13b and incident on the reference surface 14. Light reflected by the reference surface 14 changes into p-polarized light by being transmitted through the λ/4 waveplate 13b again, and this p-polarized light is transmitted through the polarizing beam splitter 13a and incident on the mirror member 13d. Light retroreflected by the mirror member 13d is transmitted through the polarizing beam splitter 13a and λ/4 waveplate 13b and incident on the reference surface 14. Then, light (reference light) reflected by the reference surface 14 changes into s-polarized light by being transmitted through the λ/4 waveplate 13b again, and this s-polarized light is reflected by the polarizing beam splitter 13a and incident on the detector 16.

On the other hand, p-polarized light (the first light 18a) emitted from the light source 11 and transmitted through the polarizing beam splitter 13a is transmitted through the λ/4 waveplate 13c and incident on the reflecting surface 15a of the reflecting portion 15. Reflected light (the second light 18b) of the first light 18a retroreflected by the reflecting surface 15a changes into s-polarized light by being transmitted through the λ/4 waveplate 13c again, and this s-polarized light is reflected by the polarizing beam splitter 13a, and incident on the mirror member 13d. Light (the third light 18c) generated by retroreflection by the mirror member 13d is reflected by the polarizing beam splitter 13a, transmitted through the λ/4 waveplate 13c, and incident on the reflecting surface 15a. Reflected light (the fourth light 18d) of the third light 18c retroreflected by the reflecting surface 15a changes into p-polarized light by being transmitted through the λ/4 waveplate 13c again, and this p-polarized light is transmitted through the polarizing beam splitter 13a, and incident as object light on the detector 16.

When the measurement apparatus 100 is configured as described above, a displacement between the optical paths of the first light 18a and second light 18b can be corrected (compensated) by a displacement between the optical paths of the third light 18c and fourth light 18d. That is, a displacement between the incident position of the fourth light 18d as object light on the detector 16 and the incident position of the reference light on the detector 16 is reduced. Even when an object (the reflecting portion 15) has moved, therefore, the position of the object can be measured accurately.

In the measurement apparatus 100 of the first embodiment, if the reflecting surface 15a inclines by pitching or yawing and the first light 18a is not perpendicularly incident on the reflecting surface 15a any longer, the phase of reflected light changes from one corner cube to another on which the first light 18a is incident. In this case, a phase distribution corresponding to the reflected light phase difference between the corner cubes on the reflecting surface 15a may be generated on the section of the second light 18b. In the measurement apparatus 100 of the first embodiment, therefore, a corner cube is used as the mirror member 13d of the optical system 13, and the phase distribution generated on the section of the second light 18b can be corrected by this corner cube.

More specifically, in the measurement apparatus 100, the second light 18b is retroreflected by the mirror member 13d (a corner cube) of the optical system 13, thereby generating the third light 18c having, on its section, a phase distribution obtained by inverting the phase distribution on the section of the second light 18b. Then, the generated third light 18c is incident on the reflecting surface 15a and reflected by the reflecting surface 15a. Consequently, the phase distribution on the section of the second light 18b, which is generated when the first light 18a is reflected by the reflecting surface 15a, can be canceled (reduced) by reflecting the third light 18c on the reflecting surface 15a. That is, the phase distribution on the section of the fourth light 18d can be made close to that on the section of the first light 18a.

<Second Embodiment>

Figure 2:
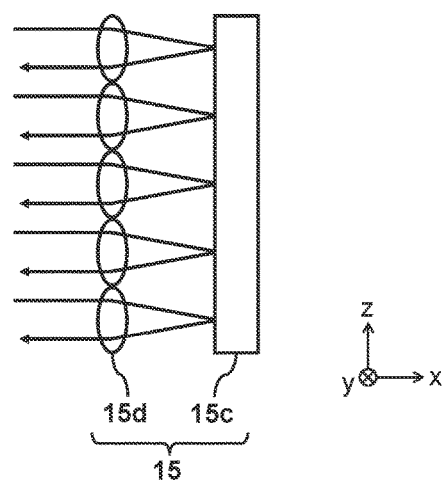
FIG. 2 is a view showing an arrangement example of a reflector.

In the first embodiment, the example in which the corner cubes 15b are used as the reflectors arrayed on the reflecting surface 15a of the reflecting portion 15 has been explained. However, the present invention is not limited to this. For example, as shown in FIG. 2, each reflector may also be configured to include a planar mirror 15c, and a lens 15d which converges light to the planar mirror 15c. FIG. 2 is a view showing a reflecting portion 15 formed by a plurality of reflectors each including the planar mirror 15c and lens 15d. Even the reflector configured as described above can retroreflect light.

<Embodiment of Lithography Apparatus>

An example in which the measurement apparatus according to the above-described embodiment is applied to a lithography apparatus for forming a pattern on a substrate will be explained. The lithography apparatus can include, e.g., an exposure apparatus which transfers a pattern of an original onto a substrate by exposing the substrate, an imprinting apparatus which molds an imprinting material on a substrate by using an original (mold), and a drawing apparatus which forms a pattern on a substrate by irradiating the substrate with a charged particle beam. In the lithography apparatus like this, the measurement apparatus according to the above-described embodiment can be used to measure the position of a stage (object) which can move while holding a substrate or original. In the following description, an example in which the measurement apparatus according to the above-described embodiment is used in the exposure apparatus will be explained.

Figure 7:
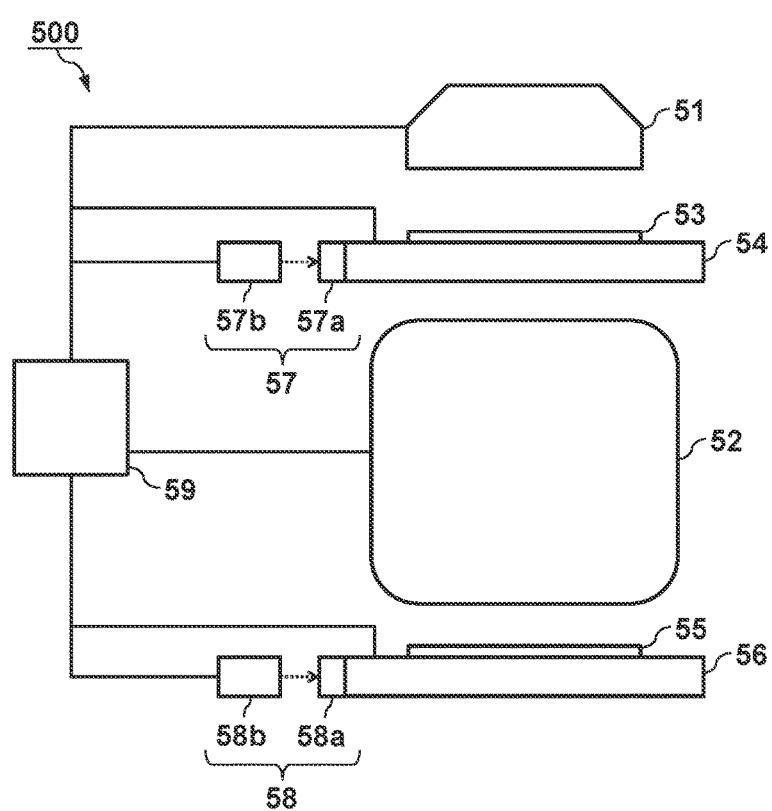
FIG. 7 is a schematic view showing an exposure apparatus.

FIG. 7 is a schematic view showing an exposure apparatus 500 to which the measurement apparatus of the present invention is applied. The exposure apparatus 500 can include an illuminating optical system 51, a projecting optical system 52, an original stage 54 for holding an original 53, and a substrate stage 56 for holding a substrate 55. The exposure apparatus 500 also includes a first measurement apparatus 57 for measuring the position of the original stage 54, and a second measurement apparatus 58 for measuring the position of the substrate stage 56. The first measurement apparatus 57 can include a reflecting portion 57a formed on the original stage 54, and a unit 57b which irradiates the reflecting portion 57a with light, and obtains the position of the original stage 54 based on the reflected light. The second measurement apparatus 58 can include a reflecting portion 58a formed on the substrate stage 56, and a unit 58b which irradiates the reflecting portion 58a with light, and obtains the position of the substrate stage 56 based on the reflected light.

It is possible to use, for example, the measurement apparatus of the first or second embodiment as the first measurement apparatus 57 and second measurement apparatus 58. In FIG. 7, each of the reflecting portions 57a and 58a is equivalent to the reflecting portion 15 in the measurement apparatus of the first or second embodiment. In addition, each of the units 57b and 58b can include the light source 11, optical system 13, reference surface 14, detector 16, processor 17, and the like in the measurement apparatus of the first or second embodiment.

The exposure apparatus 500 can further include a controller 59. The controller 59 includes a CPU, memory, and the like, and controls each unit of the exposure apparatus 500 (controls an exposing process). The controller 59 of the exposure apparatus 500 may also be configured to include the processor of the first measurement apparatus 57 and the processor of the second measurement apparatus 58.

The original 53 and substrate 55 are respectively held on the original stage 54 and substrate stage 56, and arranged in almost optically conjugate positions (the positions of an object plane and image plane of the projecting optical system 52) via the projecting optical system 52. The projecting optical system 52 has a predetermined projection magnification (for example, a magnification of ½), and projects a pattern formed on the original 53 onto the substrate 55 by using light emitted from the illuminating optical system 51. In this process, the original stage 54 and substrate stage 56 are relatively scanned in, for example, the Y direction at a speed ratio corresponding to the projection magnification of the projecting optical system 52, based on the measurement results obtained by the first measurement apparatus 57 and second measurement apparatus 58. Accordingly, the pattern formed on the original 53 can be transferred onto the substrate 55.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on a substrate by using a lithography apparatus (exposure apparatus) (step of exposing the substrate) and a step of processing (for example, developing) the substrate on which the pattern is formed in the above step. The manufacturing method further includes other well-known steps (for example, oxidation, deposition, vapor deposition, doping, planarization, etching, resist removal, dicing, bonding, and packaging). When compared to the conventional methods, the method of manufacturing the article according to this embodiment is advantageous in at least one of the performance, quality, productivity, and production cost of the article.

<Other Embodiments>

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-163088 filed on Aug. 20, 2015, which is hereby incorporated by reference herein in its entirety.

What is claimed is:

1. A measurement apparatus for measuring a position of an object, comprising:
    a reflecting portion provided on the object and having a reflecting surface on which a plurality of reflectors configured to respectively retroreflect light are arrayed;
    an optical system configured to cause first light to be incident on the reflecting surface, receive second light as reflected light of the first light from the reflecting surface, cause third light generated by reflecting the second light by a mirror member to be incident on the reflecting surface, and receive fourth light as reflected light of the third light from the reflecting surface; and
    a processor configured to determine the position of the object based on a result of detecting the fourth light and a reference light,
    wherein the plurality of reflectors are arrayed on the reflecting surface such that a displacement between optical paths of the first light and the second light is corrected by a displacement between optical paths of the third light and the fourth light.

2. The apparatus according to claim 1, wherein the mirror member of the optical system includes a corner cube.

3. The apparatus according to claim 1, wherein each of the plurality of reflectors includes a corner cube.

4. The apparatus according to claim 1, wherein each of the plurality of reflectors includes a planar mirror, and a lens configured to converge light to the planar mirror.

5. The apparatus according to claim 1, further comprising a detector configured to detect the fourth light received by the optical system and the reference light,
wherein the processor determines the position of the object based on a detection result obtained by the detector.

6. The apparatus according to claim 5, wherein the detector detects an intensity difference between the fourth light received by the optical system and the reference light.

7. The apparatus according to claim 1, wherein each of the plurality of reflectors is configured such that the displacement between the optical paths of the first light and the second light is less than or equal to 100 μm.

8. A lithography apparatus for forming a pattern on a substrate, comprising:
a stage configured to be movable while holding the substrate; and
a measurement apparatus configured to measure a position of the stage as an object,
wherein the measurement apparatus includes:
a reflecting portion provided on the object and having a reflecting surface on which a plurality of reflectors configured to respectively retroreflect light are arrayed;
an optical system configured to cause first light to be incident on the reflecting surface, receive second light as reflected light of the first light from the reflecting surface, cause third light generated by reflecting the second light by a mirror member to be incident on the reflecting surface, and receive fourth light as reflected light of the third light from the reflecting surface; and
a processor configured to determine the position of the object based on a result of detecting the fourth light and a reference light,
wherein the plurality of reflectors are arrayed on the reflecting surface such that a displacement between optical paths of the first light and the second light is corrected by a displacement between optical paths of the third light and the fourth light.

9. A method of manufacturing an article, the method comprising:
forming a pattern on a substrate using a lithography apparatus; and
processing the substrate, on which the pattern has been formed, to manufacture the article,
wherein the lithography apparatus includes a stage configured to be movable while holding the substrate, and a measurement apparatus configured to measure a position of the stage as an object, and
wherein the measurement apparatus includes:
a reflecting portion provided on the object and having a reflecting surface on which a plurality of reflectors configured to respectively retroreflect light are arrayed;
an optical system configured to cause first light to be incident on the reflecting surface, receive second light as reflected light of the first light from the reflecting surface, cause third light generated by reflecting the second light by a mirror member to be incident on the reflecting surface, and receive fourth light as reflected light of the third light from the reflecting surface; and
a processor configured to determine the position of the object based on a result of detecting the fourth light and a reference light,
wherein the plurality of reflectors are arrayed on the reflecting surface such that a displacement between optical paths of the first light and the second light is corrected by a displacement between optical paths of the third light and the fourth light.

10. The apparatus according to claim 1, wherein the plurality of reflectors are arrayed on the reflecting surface such that a cross-sectional phase distribution of the fourth light is made close to a cross-sectional phase distribution of the first light.

11. The apparatus according to claim 10, wherein the mirror member of the optical system is configured to reflect the second light so as to generate the third light having a cross-sectional phase distribution in which a cross-sectional phase distribution of the second light is inverted.

* * * * *